US005248895A

United States Patent [19]

Nakazawa

[11] Patent Number: 5,248,895

[45] Date of Patent: Sep. 28, 1993

[54] SEMICONDUCTOR APPARATUS HAVING RESIN ENCAPSULATED TAB TAPE CONNECTIONS

[75] Inventor: Tsutomu Nakazawa, Yokohama, Japan

[73] Assignee: Kabushiki Kaisha Toshiba, Kawasaki, Japan

[21] Appl. No.: 822,721

[22] Filed: Jan. 21, 1992

[30] Foreign Application Priority Data

Jan. 21, 1991 [JP] Japan .................................. 3-005238

[51] Int. Cl.[5] .............................................. H01L 23/48

[52] U.S. Cl. .................................... 257/668; 257/669; 257/673; 257/676; 257/787

[58] Field of Search ............................ 357/70, 72, 74; 257/668, 669, 673, 676, 787

[56] References Cited

U.S. PATENT DOCUMENTS 4,147,889 4/1979 Andrews et al. .................... 357/70
4,330,790 5/1982 Burns .................................. 357/70
4,459,607 7/1984 Reid .................................... 357/70
4,796,078 1/1989 Phelps, Jr. et al. .................. 357/70
4,839,713 6/1989 Teraoka et al. ...................... 357/70
5,031,022 7/1991 Yamamoto et al. .................. 357/72

*Primary Examiner*—Eugene R. LaRoche
*Assistant Examiner*—Viet Q. Nguyen
*Attorney, Agent, or Firm*—Foley & Lardner

[57] ABSTRACT

A semiconductor apparatus with high thermal radiating property and a method for producing the same is provided. The semiconductor apparatus comprises a TAB tape 11 having an inner wire 13 and a middle wire; a semiconductor chip 1 connected to the inner wire 13 through a bump 12; and a lead frame 3 having as an integral structure a middle lead connected to the middle wire 14 and a metallic bed 5 in contact with the semiconductor chip 1. The shape of the bed 5 is nearly constant regardless of the size of the semiconductor chip 1. The bed 5 extends nearly to each outer edge of a sealing plastic resin 2. The heat generated in the semiconductor chip 1 is effectively radiated to the outside through the extending bed 5 of the lead frame 3.

2 Claims, 5 Drawing Sheets

SEMICONDUCTOR APPARATUS HAVING RESIN ENCAPSULATED TAB TAPE CONNECTIONS

BACKGROUND OF THE INVENTION

The present invention relates to a semiconductor apparatus sealed with resin and a method for producing the same.

Conventionally, a wire bonding type semiconductor apparatus comprises a metal lead frame and a semiconductor chip. The metal lead frame has a bed, an inner bed, and an outer lead, each of which is integrally constructed therewith. The semiconductor chip is mounted on a bed. The semiconductor chip and the inner lead are connected through a bonding wire. The semiconductor chip, the bonding wire, and their neighboring portions are sealed with a plastic resin.

As the integration and processing speed of semiconductor apparatuses increase, they proportionally increase the heat generated. Thus, the heat generated by the semiconductor chip should be effectively radiated.

Another wire bonding type semiconductor apparatus is known which effectively radiates the heat generated therefrom. This wire bonding type semiconductor apparatus has a bed on which a semiconductor chip is mounted, the size of the bed being much larger than that of the semiconductor chip, the bed being extended nearly to each outer edge of a plastic resin. According to this wire bonding type semiconductor apparatus, since the large bed having high thermal conductivity is in contact with the semiconductor chip which radiates heat in the plastic resin having low thermal conductivity, the heat generated in the semiconductor chip can be effectively radiated.

However, as the size of the bed becomes large, the distance between the semiconductor chip and the inner lead becomes large. Thus, since the length of the bonding wire between the semiconductor chip and the inner lead proportionally becomes large, the bonding wire may occasionally contact the bed and therefore result in electric leakage.

On the other hand, a TAB type semiconductor apparatus is known. The TAB type semiconductor apparatus comprises a metal lead frame and a TAB tape. The metal lead frame has a middle lead and an outer lead. The TAB tape has an inner wire and a middle wire. The inner wire and the middle wire are connected through a connection wire. A semiconductor chip is connected to the inner wire through a bump. The middle wire of the TAB tape is connected to the middle lead of the lead frame. The semiconductor chip, the TAB tape, and their peripheral portions are sealed with a plastic resin.

Then, a method for producing the TAB type semiconductor apparatus is described below.

First, a substrate made of a polyimide is prepared. After this substrate is punched out, it is laminated with a copper foil. Thereafter, the copper foil is photo-patterned, etched, and then plated. Thereby, a TAB tape is produced.

A conventional wafer can be prepared. Thereafter, a bump forming process and a probing process are performed on the wafer. Thereby, a semiconductor chip is produced.

In addition, a metal material is prepared. For this metal material, a photo-pattern process, an etching process, and a plating process are performed. Thereby, a lead frame is produced.

Thereafter, the semiconductor chip and the inner wire of the TAB tape are connected through the bump. Thereafter, an outer portion of the middle wire of the TAB tape is cut so as to expose the middle wire to the outside.

Thereafter, the middle wire of the TAB tape and the middle lead of the lead frame are connected. Thereafter, the semiconductor chip, the TAB tape, and their neighboring portions are sealed with a plastic resin.

Thereafter, for the semiconductor chip and the TAB tape, which are sealed, a sheathing process and an outer lead forming process are performed. Thereby, a TAB type semiconductor apparatus is produced. Thereafter, for the semiconductor apparatus, a verification process is performed.

Since the semiconductor chip of the TAB type semiconductor apparatus is not in contact with the metal lead frame, heat generated in the semiconductor chip is radiated through the plastic resin having low thermal conductivity. Thus, the thermal radiating property of the TAB type semiconductor apparatus is not high.

As described above, when the size of the bed of the wire bonding type semiconductor apparatus is large, the bonding wire becomes accordingly very long. Thus, the bonding wire may occasionally contact the bed, resulting in electric leakage.

In contrast, the TAB type semiconductor apparatus is free from the problem of electric leakage. However, the heat generated in the semiconductor chip is radiated through the plastic resin having low thermal conductivity. Thus, the thermal radiating property of the TAB type semiconductor apparatus is low.

SUMMARY OF THE INVENTION

It is therefore an object of the present invention to provide a semiconductor apparatus which is free from such electric leakage and has high thermal radiating property, and a method for producing the same.

The present invention is embodied in a semiconductor apparatus comprising a TAB tape having an inner wire and a middle wire; a semiconductor chip connected through a bump to the inner wire of the TAB tape; a metallic lead frame having as an integral structure a middle lead connected to the middle wire of the TAB tape, an outer lead connected to the middle lead, and a bed in contact with the semiconductor chip; and a resin for sealing the semiconductor chip, the TAB tape, and their neighboring portions. The present invention is further embodied in a method for producing a semiconductor apparatus comprising the steps of connecting through a bump a semiconductor chip to an inner wire of a TAB tape, contacting a bed of a lead frame to the semiconductor chip, connecting a middle lead of the lead frame to a middle wire of the TAB tape, and sealing the semiconductor chip, the TAB tape, and their neighboring portions with a resin.

According to the present invention, since the semiconductor apparatus is provided with the metallic bed in contact with the semiconductor chip, heat generated in the semiconductor chip can be effectively radiated to the outside of the semiconductor apparatus through the metallic bed.

DESCRIPTION OF THE INVENTION

A semiconductor apparatus and a method for producing the same according to the present invention will be described below with reference to FIGS. 1 to 7. FIGS. 1 to 5 show a first embodiment of a semiconductor apparatus according to the present invention and a method for producing the same.

Figure 1:
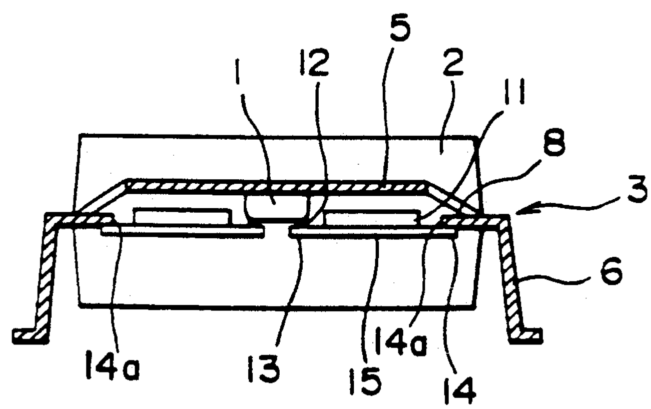
FIG. 1 is a side sectional view showing a first embodiment of a semiconductor apparatus according to the present invention.

A semiconductor apparatus according to the present invention shown in FIG. 1 comprises a metallic lead frame 3 and a TAB tape 11. The metal lead frame 3 has as an integral structure a bed 5, a middle lead 8, and an outer lead 6. The TAB tape 11 has an inner wire 13 and a middle wire 14. The inner wire 13 and the middle wire 14 are connected through a connection wire 15. The inner wire 13 and a semiconductor chip 1 are connected through a bump 12. The middle wire 14 of the TAB tape 11 and the middle lead 8 of the lead frame are directly connected. The semiconductor chip 1, the TAB tape 11, and their neighbor portions are sealed with a plastic resin 2.

The bottom surface of the bed 5 of the lead frame 3 is in contact with the upper surface of the semiconductor chip 1. The size of the bed 5 is much larger than that of the semiconductor chip 1. The bed 5 widely extends regardless of the size of the semiconductor chip 1. In other words, the bed 5 extends to the portion which is 5 mm inside of each outer edge of the plastic resin 2.

In FIG. 1, the middle lead 8 of the lead frame 3 and the TAB tape 11 are disposed nearly on the same horizontal plane. The bed 5 of the lead frame 3 is disposed at a higher position than the middle lead 8 by the thickness of the semiconductor chip 1.

A method for producing the semiconductor apparatus above mentioned will be described.

Figure 2:
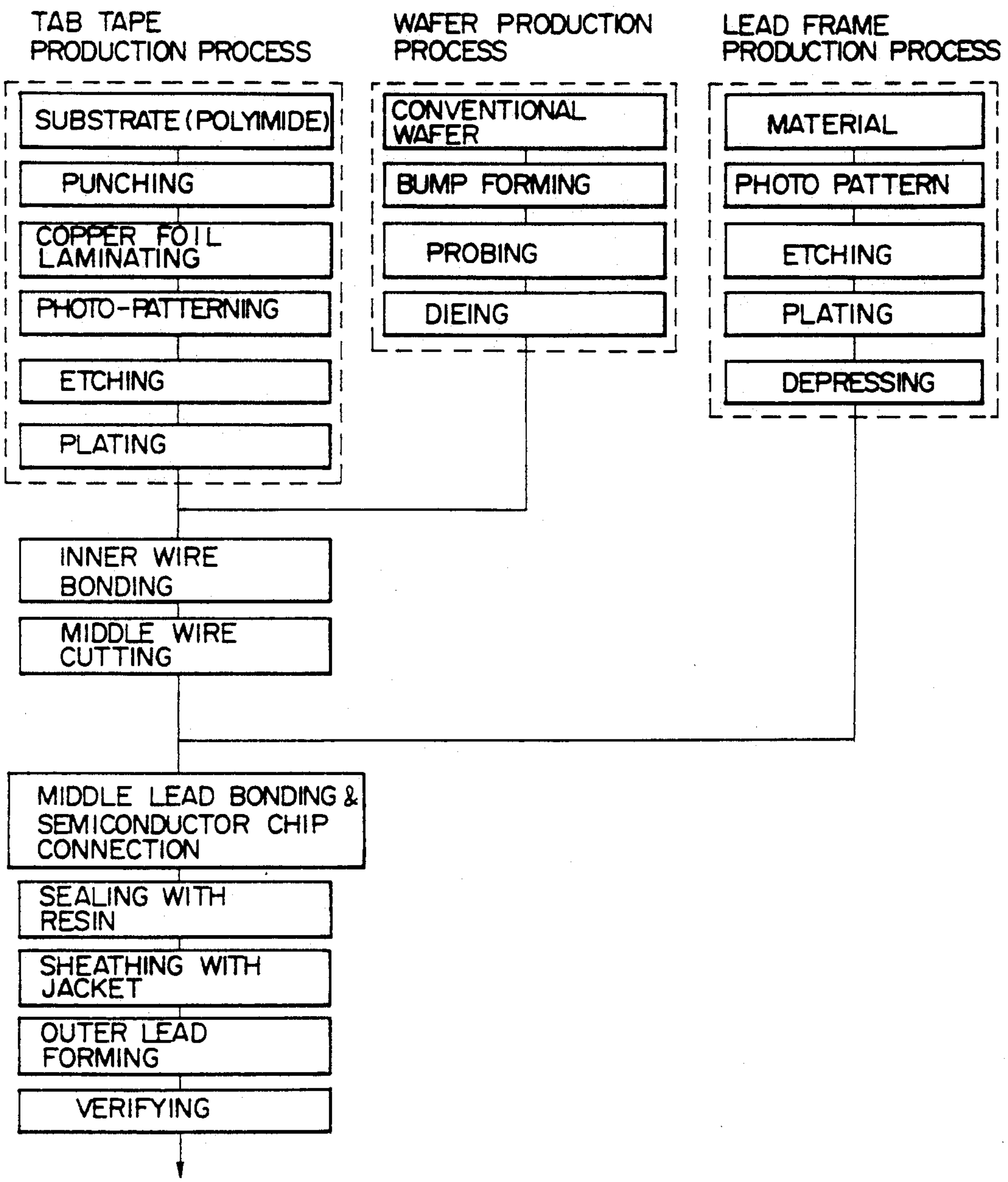
FIG. 2 is a flow chart showing a method for producing the semiconductor apparatus shown in FIG. 1.
Figure 3:
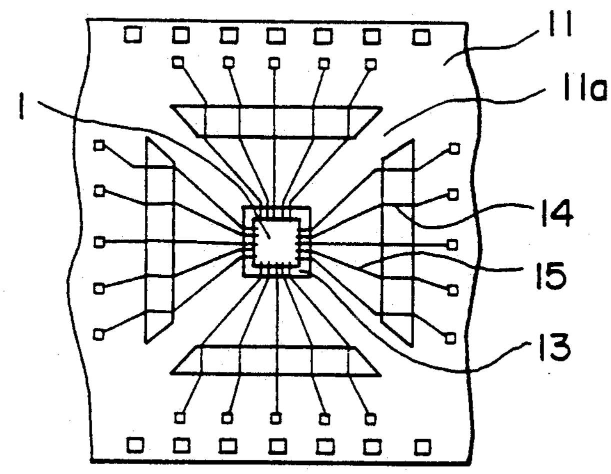
FIG. 3 is a plan view of a TAB tape for use in the production of the semiconductor apparatus.

As shown in FIG. 2, first, a substrate made of polyimide is prepared. After the substrate is punched, the substrate is laminated with a copper foil. Thereafter, for the copper foil, a photo-pattern process, an etching process, and a plating process are performed. Thereby, a TAB tape 11 as shown in FIG. 3 is produced.

On the other hand, as shown in FIG. 2, a conventional wafer is prepared. Thereafter, a bump forming process, a probing process, and a dicing process are performed on the wafer. Thereby, a semiconductor chip 1 is produced.

Figure 4:
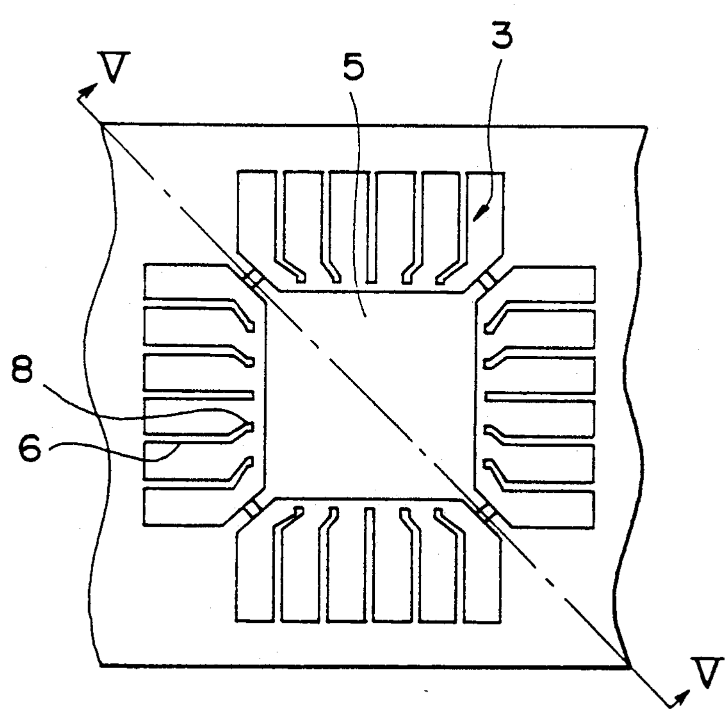
FIG. 4 is a plan view of a lead frame for use in the production of the semiconductor apparatus.
Figure 5:
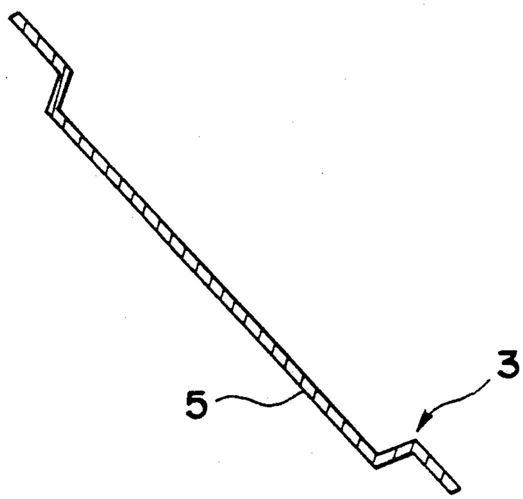
FIG. 5 is a sectional view of the lead frame taken along the line V—V of FIG. 3.

In addition, a metallic material as shown in FIG. 2 is prepared. For this material, a photo-pattern process, an etching process, a plating process, and a depressing process are performed. Thereby, a lead frame 3 as shown in FIG. 4 is produced. In the depressing process, the bed 5 of the lead frame 3 is pressed so as to make a gap between the bed 5 and other portions of the lead frame 3. This gap is nearly the same as the thickness of the semiconductor chip 1 (refer to FIG. 5).

Thereafter, the semiconductor chip 1 and the inner wire 13 of the TAB tape 11 are connected through the bump 12. Thereafter, an outer portion of each middle wire 14 and unnecessary portions 11a of the TAB tape 11 are cut so as to expose the middle wire 14 to the outside, as shown in FIG. 3.

Thereafter, the middle wire 14 of the TAB tape 11 and the middle lead 8 of the lead frame 3 are connected. At the same time, the semiconductor chip 1 are contacted to the bed 5 of the lead frame 3. Thereafter, the semiconductor chip 1, the TAB tape 11, and their neighbor portions are sealed with a plastic resin 2.

Thereafter, for the semiconductor chip 1 and the TAB tape 11, which are sealed, a sheathing process and an outer lead forming process are performed. Thereby, a TAB type semiconductor apparatus as shown in FIG. 1 is produced. Thereafter, for the semiconductor apparatus, a verification process is performed.

According to the above mentioned embodiment, heat generated in the semiconductor chip 1 is radiated through the metallic bed 5 connected to the semiconductor chip 1. In this case, since the bed 5 extends to nearly each outer edge of the plastic resin 2, the heat generated in the semiconductor chip 1 can be effectively radiated to the neighbor portion of each outer edge of the plastic resin 2 through the silicon semiconductor chip 1 and the metal bed 5 both of which have higher thermal conductivity. Thus, the semiconductor chip 1 which consumes much electric power because of high integration and high processing speed can maintain normal operations thereof.

EXAMPLE

An example of the above mentioned embodiment will be described in details.

The thermal resistance of a conventional semiconductor apparatus having 144 pins and a 5 mm square semiconductor chip in QFP (Quad Flat Package) construction was approximately 80° C./w.

The semiconductor apparatus according to the present invention could improve the thermal resistance to approx. 60° C./w.

Thus, when the operating critical temperature of the semiconductor apparatus is 85° C., the semiconductor apparatus can be operated at normal temperature of 25° C. In other words, when the same semiconductor chip is used in the conventional semiconductor apparatus, the ambient temperature should be kept at 5° C. or below or the sealing body should be changed from the plastic resin to ceramic or the like, because the conventional semiconductor apparatus has low thermal radiating property.

A second embodiment according to the present invention is described below with reference to FIGS. 6 and 7.

Figure 6:
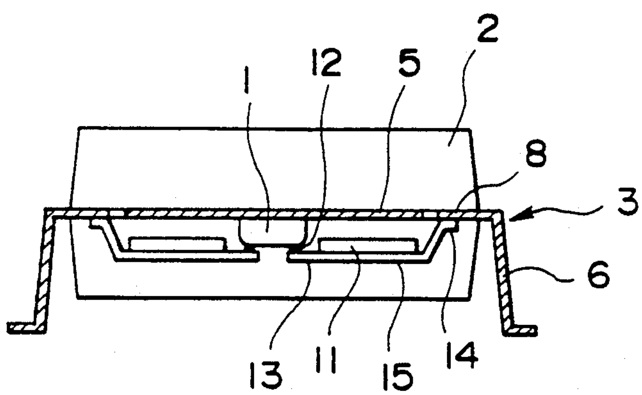
FIG. 6 is a side sectional view showing a second embodiment of the semiconductor apparatus according to the present invention.

As shown in FIG. 6, in a semiconductor apparatus according to the second embodiment, a middle lead 8 of a lead frame 3 and a bed 5 are disposed on the same plane. In addition, a middle wire 14 of a TAB tape 11 is bent upwardly and connected to the middle lead 8 of the lead frame 3. Other portions of the second embodiment are the same as those of the first embodiment shown in FIGS. 1 to 5.

A method for producing the semiconductor apparatus of the second embodiment above mentioned is described in details.

Figure 7:
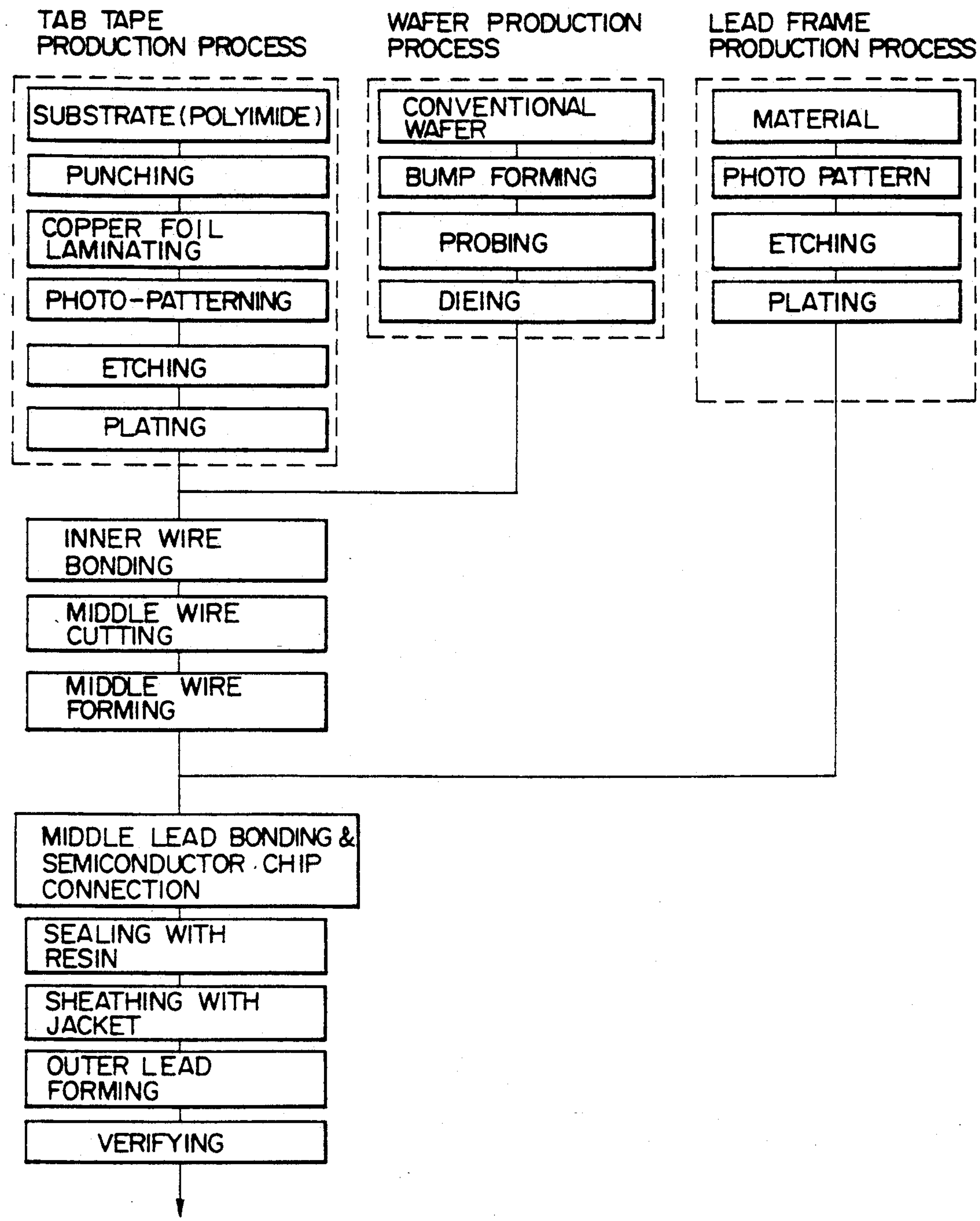
FIG. 7 is a flow chart showing a method for producing the semiconductor apparatus shown in FIG. 6.

As shown in FIG. 7, at first, a substrate made of polyimide is prepared. After the substrate is punched, the substrate is laminated with a copper foil. Thereafter, for the copper foil, a photo-pattern process, an etching process, and a plating process are performed. Thereby, a TAB tape 11 is produced (refer to FIG. 3).

On the other hand, as shown in FIG. 7, a conventional wafer is prepared. Thereafter, a bump forming process, a probing process, and a dicing process are performed on the wafer. Thereby, a semiconductor chip 1 is produced.

In addition, a metallic material as shown in FIG. 7 is prepared. For this material, a photo-pattern process, an etching process, and a plating process are performed. Thereby, a lead frame 3 is produced (refer to FIG. 4).

Thereafter, the semiconductor chip 1 and the inner wire 13 of the TAB tape 11 are connected through the bump 12. Thereafter, an outer portion of each middle wire 14 and unnecessary portions 11*a* of the TAB tape 11 are cut so as to expose the middle wire 14 to the outside. Thereafter, the middle wire 14 of the TAB tape 11 is bent upwardly by a forming process to easily connect the middle wire 14 with the middle lead 8 of the lead frame 3.

Thereafter, the middle wire 14 of the TAB tape 11 and the middle lead 8 of the lead frame 3 are connected. In addition, the semiconductor chip 1 contacts the bed 5 of the lead frame 3. Thereafter, the semiconductor chip 1, the TAB tape 11, 11 and the neighboring portions thereof are sealed with a plastic resin 2.

Thereafter, for the semiconductor chip 1 and the TAB tape 11, which are sealed, a sheathing process and an outer lead forming process are performed. Thereby, a TAB type semiconductor apparatus as shown in FIG. 6 is produced. Thereafter, for the semiconductor apparatus, a verification process is performed.

What is claimed is:

1. A semiconductor apparatus comprising:

a TAB (Tape Automated Bonding) tape having an inner wire and a middle wire;

a semiconductor chip connected through a bump to said inner wire of said TAB tape;

a metallic lead frame having, as an integral structure, a middle lead, an outer lead, and a bed, said middle lead being electrically connected at connection points to said middle wire of said TAB tape, said outer lead being connected to said middle lead, said bed being in contact with said semiconductor chip; and a resin for encapsulating at least said semiconductor chip, said TAB tape, and neighboring portions thereof, including said connection points and said bed; said bed extending to each outer edge of said resin, the length of the bed being substantially the same as the length of said TAB tape.

2. The semiconductor apparatus as set forth in claim 1, wherein said semiconductor chip is in contact with a bottom surface of said bed of said lead frame.

* * * * *